(12) United States Patent
Davies et al.

(10) Patent No.: US 6,462,581 B1
(45) Date of Patent: Oct. 8, 2002

(54) PROGRAMMABLE TIMING BOUNDARY IN DYNAMIC CIRCUITS

(75) Inventors: Andrew Douglas Davies, Rochester, MN (US); Salvatore N. Storino, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/541,289

(22) Filed: Apr. 3, 2000

(51) Int. Cl.[7] .................................... H03K 19/096
(52) U.S. Cl. ............... 326/95; 326/93; 326/97; 326/98; 326/112
(58) Field of Search ............... 326/17, 93, 95, 326/96, 97, 98, 112; 365/203

(56) References Cited

U.S. PATENT DOCUMENTS

| | | | | |
|---|---|---|---|---|
| 5,532,625 A | * | 7/1996 | Rajivan | 326/98 |
| 5,815,005 A | * | 9/1998 | Bosshart | 326/95 |
| 5,841,300 A | * | 11/1998 | Murabayashi et al. | 326/98 |
| 6,002,292 A | * | 12/1999 | Allen et al. | 327/379 |
| 6,040,716 A | * | 5/2000 | Bosshart | 326/98 |
| 6,208,907 B1 | * | 3/2001 | Durham et al. | 700/121 |

FOREIGN PATENT DOCUMENTS

| | | | | |
|---|---|---|---|---|
| JP | 03263919 A | * | 11/1991 | 326/97 |
| JP | 63093222 A | * | 4/1998 | 326/96 |

* cited by examiner

*Primary Examiner*—Michael Tokar
*Assistant Examiner*—Steven S. Paik
(74) *Attorney, Agent, or Firm*—Karuna Ojanen

(57) ABSTRACT

A circuit and a method to realize a programmable delay between two adjacent signal paths, each having a different timing domain. In a preferred embodiment, each signal path is a stage of domino logic and the programmable delay is positioned at the boundary to adjust the timing between the two stages. The delay is programmed depending upon the value of an input signal to be either a static delay and hence part of the first stage of domino logic; or a dynamic delay to be part of a subsequent stage of domino logic. Critical paths can easily be balanced after fabrication, either at wafer test or once the circuit is mounted on an integrated chip and then tested, with the programmable gate as disclosed herein.

14 Claims, 8 Drawing Sheets

PROGRAMMABLE TIMING BOUNDARY IN DYNAMIC CIRCUITS

TECHNICAL FIELD

This invention relates generally to the field of integrated circuits and more particularly relates to a method and apparatus to inserting a programmable delay in dynamic circuits.

BACKGROUND OF THE INVENTION

The endeavor for faster and faster circuits have reached remarkable milestones since their inception and coming of age during the past sixty years, especially logic circuits in connection with the development of computers. The beginning of the computer age was characterized by connecting vacuum tubes with large coaxial cables for wiring analog logic. If a new problem was to be solved, the cables were reconfigured. Today, coaxial cables have been replaced with high speed data buses; vacuum tubes have been replaced with high speed logic circuits whose transistors are fabricated from new semiconductor materials and designs, all of which are limited only by the laws of physics.

While much work has been done in the arrangement of parts of a computer by, e.g., bringing memory closer to the processor and incorporating cache memories, etc., the real determination of how fast or how slow a computer is is dependent upon the circuit elements at the electronic level. Transistors themselves have become faster and a major aspect of circuit design is fine-tuning the delays associated with numerous signals to make the circuit as fast as possible and yet still maintain spatial and heat dissipation requirements.

Delay simply refers to a signal not arriving when it is expected, whether it be a clock signal or a data signal. In fact, hardware delays are often intentionally inserted into a complex circuit design to synchronize the arrival or evaluation of a particular signal in one part of the circuit with another part of the circuit, or to synchronize the arrival of two signals. The insertion of intentional delays is a critical aspect of circuit design. The problem of the precision of the delay predicted by computerized design models versus the delay in the actual manufactured hardware is described by the term "hardware-to-model correlation." If the models predict the delays of the hardware closely, then the hardware-to-model correlation is said to be good. If, however, the hardware delays don't match the predicted simulation delays then the hardware-to-model correlation is poor. In actuality, it is not possible to create exact models for delay that match the hardware and sometimes hardware-to-model correlation can be quite bad. This is particularly true with new technologies like silicon-on-insulator (SOI) technology or even with fast versions of traditional bulk CMOS technology.

A critical path simply refers to the slowest path through a circuit and usually starts and ends with a latch boundary, a latch being the hardware to store or evaluate a single bit. Especially with the newer technologies, a critical path can be slower than predicted by the models significantly hampering the maximum performance of the system. All too often, moreover, poor correlation isn't discovered until testing the hardware after it has been fabricated and then it is too late to change the timing delay. A designer knows that not every signal path is a critical path and in a standard distribution of timing paths of circuits, the critical paths are on the slow end of the bell curve. From experience and computer simulation modeling, moreover, a designer also knows where the critical paths are and delays can be removed or inserted into other synchronizing paths during the design. In cases, however, where one critical path feeds another critical path it is difficult to know which path is slower because of inaccurate modeling. The designer may not know whether to take logic out of one path and place it in the other or vice versa in order to achieve a speedup because the delays cannot be reasonably predicted.

One such technology that is capable of achieving high speeds and high density of electronic components in custom integrated circuit design is dynamic CMOS. Dynamic CMOS differs from static CMOS because whereas static CMOS incorporates pull-up and pull-down transistor networks to calculate whether an input signal is a digital "1" or a digital "0", dynamic CMOS uses parasitic capacitance, previously considered detrimental in static CMOS, to advantage. In dynamic CMOS, the output node of a combinational logic gate is precharged to a voltage, Vdd, just prior to the evaluation of the logic function and may be conditionally discharged to ground using only one pull-down network, depending on the particular values of input signals. If the inputs are such that the logic function should be a logical "0", then the pull-down output node turns ON and the precharged voltage is discharged quickly to ground. If the inputs are such that the logic function should be "1", the pull-down output node remains OFF and at Vdd.

Several stages of these dynamic CMOS field effect transistors can be configured into a circuit called domino logic because like a row of closely-spaced dominos which have been stood on end, once a signal enters the first latch the signal quickly propagates or cascades to all other circuit elements in the domino circuit like all the other dominos falling once the first domino has been tipped. The first stage of a domino circuit typically comprises a precharge device, typically a p-type field effect transistor (pfet) whose drain is connected to a pull-down network of n-type field effect transistors (nfets) and an evaluate transistor, typically an nfet whose source is connected to the same pull-down network. Precharge occurs on one phase of the clock, a signal is input, and the evaluate occurs on the other phase of the clock. According to the standard rules of domino logic, an evaluate device is required for the first dynamic gate after a latch in order to ensure that the precharge completes successfully. To prevent a signal from propagating to the next domino stage, the output A of each stage has a static CMOS inverter or equivalent to perform a logic inversion that provides the intended causal evaluation of a cascade of many such stages.

Referring to the figures wherein like numerals refer to the same or similar elements throughout and in particular with reference to FIGS. 1(*a*) and 1(*b*), therein shown are simplified block diagrams of two possible configurations of a conventional domino circuit with the same logic function in which one critical path 150 feeds another critical path 160. The circuit of FIG. 1(*a*) is essentially the same circuit as FIG. 1(*b*) except that the first gate after latch 118 may be a static gate 120 or a dynamic gate 140. If it is a static gate 120, as in FIG. 1(*a*), the timing boundary or critical path starts on CLK0 110 and ends on SINKA 122. If the gate after latch 118 is a dynamic gate 140, as shown in FIG. 1(*b*), the timing boundary/critical path starts on CLK0 110 and ends on SINKB 144. The designer chooses based on the simulation modeling whether to make the first gate after latch 118 a static gate or a dynamic gate specifically to move the timing boundary between the two critical paths 150, 160. If the designer uses a static gate 120, the designer adds the delay of that gate to the first critical path 150; by using a dynamic gate 140, the designer add the delay to the second critical path 160.

FIG. 2 is a conventional dynamic delay inserted after latch 118 in FIG. 1(b). The output SINKB 144 of latch 118 is input into dynamic gate 140. Dynamic gate 140 comprises a precharge device, pfet P10, and an evaluate device, nfet N10. To prevent cascading onto the next stage, there is a domino inverter INV10. Similarly dynamic gate 126 has a precharge of pfet P20 and an evaluate transistor N20. Inverters INV10 and INV20 are standard elements of domino circuits to buffer dynamic stages. Nfet networks 210 and 220 may perform a logical operation on the input signal SINKB 144. The operation of these domino circuit delays is known in the art and will not be explained here.

If the designer can accurately model the circuit delays, he/she can balance the delay of the two critical paths to maximize system performance. But model simulations are not always accurate and if the designer made the wrong decision as discussed earlier, there would be too much delay in one critical path and less in the other and the error would not be uncovered until the circuit was actually fabricated in hardware. Thus, if the designer opted for the design of FIG. 1(a) but critical path 150 already was the slowest path, the designer only exacerbated the problem and made critical path 150 even slower. If, however, critical path 160 was the slowest path and the designer opted for placement of dynamic gate 140 into critical path 160, the designer also increased the delay and slowed the circuit further.

There is thus a need in the industry to create a programmable timing boundary that can be used in dynamic circuits that can be inserted during the design so that the circuits can be fabricated and the choice of which timing domain to insert the programmable boundary could be determined after fabrication.

SUMMARY OF THE INVENTION

These needs and others that will become apparent to one skilled in the art are satisfied by a method to increase the speed of a manufactured electronic system having a plurality of domino logic circuits in which at least one of the domino logic circuits has at least one delay, the method comprising removing the at least one delay from the at least one domino logic circuit and including the delay in an adjacent domino logic circuit.

The invention is further embodied in a method to increase the speed of an electronic system having a plurality of logic circuits, the logic circuits comprising at least two stages: a first stage being on during a first timing domain; and a second stage being on during a second timing domain and the second stage being slower than the first stage, the method comprising moving a programmable hardware timing boundary from the second stage to the first stage.

The invention may also be considered a method to move a timing boundary between two adjacent timing paths; the method comprising: placing a programmable gate at a boundary of the two adjacent timing paths; programming the programmable gate to be included in a first of the two adjacent timing paths; or, alternatively, programming the programmable gate to be included in a second of the two adjacent timing paths; and inputting a first signal to program the programmable gate. The step of programming may further comprise programming the programmable gate to be a static gate when the first signal is high. In an alternative embodiment, the step of programming may further comprising programming the programmable gate to be a first dynamic gate when the first signal is low.

The method may further comprise testing a circuit having the two adjacent timing paths which are critical paths to determine which of the critical paths is the slower; and then inputting the input signal to place the programmable gate in the faster of the two critical paths. The testing may occur when the circuits are in a semiconductor wafer; or when the circuits are mounted on an electronic chip.

The method may also comprise testing a circuit having the two adjacent timing paths which are also critical paths to determine which of the paths is the slower and then inputting the input signal to place the programmable gate into the slower of the two critical paths.

The step of programming the programmable gate to be a static gate may further comprise degating a precharge device and shorting an evaluate device in the programmable gate.

The step of programming the programmable gate to be a dynamic gate may further comprise charging a precharge node with a precharge device in the programmable gate; allowing a first evaluate device in the programmable gate to evaluate a value of an input logic signal; favoring a rising edge of an output signal from the programmable gate; and shorting out a second evaluate device in an adjacent second dynamic gate of the second timing path.

It is further contemplated that the invention is an electronic system comprising a number of domino logic circuits having programmable timing boundaries that can be changed by a plurality of gates, each of which can be programmed to be either a static gate or a dynamic gate.

The invention is also an electronic circuit, comprising: a first stage having a first timing domain; a second stage adjacent to the first stage but having a second timing domain; a programmable gate at a boundary of the first stage and the second stage, the programmable gate capable of being in either the first stage or the second stage.

The electronic circuit may be a logic circuit and the first stage and the second stages may be domino stages. In a logic circuit, the programmable gate may further comprise a program signal to program the programmable gate; a precharge device connected to a clock signal; an evaluate device connected to the clock signal; a logic network to perform a digital operation on a logic signal; and a shorting device connected to the program signal. The programmable gate may further comprise a complementary logic network and whereupon when the program signal is high, the precharge device is degated from the logic circuit and the shorting device shorts the evaluate device, and the logic network forms a static gate with the complementary logic network and the programmable gate included in the first domino stage.

In the logic circuit, whereupon the program signal being high, the precharge device precharges the precharge node, and the evaluate device evaluates a logic output from the logic network which forms a dynamic gate and the programmable gate is included in the second domino stage. The second domino stage may further comprise a second dynamic gate and a second evaluate device in which the programmable gate causes the second evaluate device to be shorted.

The invention may further be considered an electronic circuit having an adjustable timing boundary between two adjacent stages, comprising; means to input a program signal; means to program a delay gate to comprise a first of the two adjacent stages upon the value of the program signal; and means to program the delay gate to comprise a second of the two adjacent stages upon a different value of the program signal.

This invention creates a programmable timing boundary for dynamic circuits such that the designer can take a delay out of one critical path and put it in another on the hardware and is capable of placing the delay so that the dynamic circuit is fastest based on actual hardware data.

This invention provides a programmable timing boundary by creating a new gate that can be programmed to be a static gate or a dynamic gate. Further scope of applicability of the present invention will become apparent from the detailed description given herein. It should be understood, however, that the detailed description and the specific examples, while indicating preferred embodiments of the invention, are given by way of illustration only. Various changes and modifications within the spirit and scope of the invention will become apparent to those skilled in the art upon review of the detailed description.

BRIEF DESCRIPTION OF THE DRAWING

The present invention will become more fully understood from the detailed description and accompanying drawings, wherein.

DETAILED DESCRIPTION OF THE PREFERRED EMBODIMENT

Figures 1, 1A:
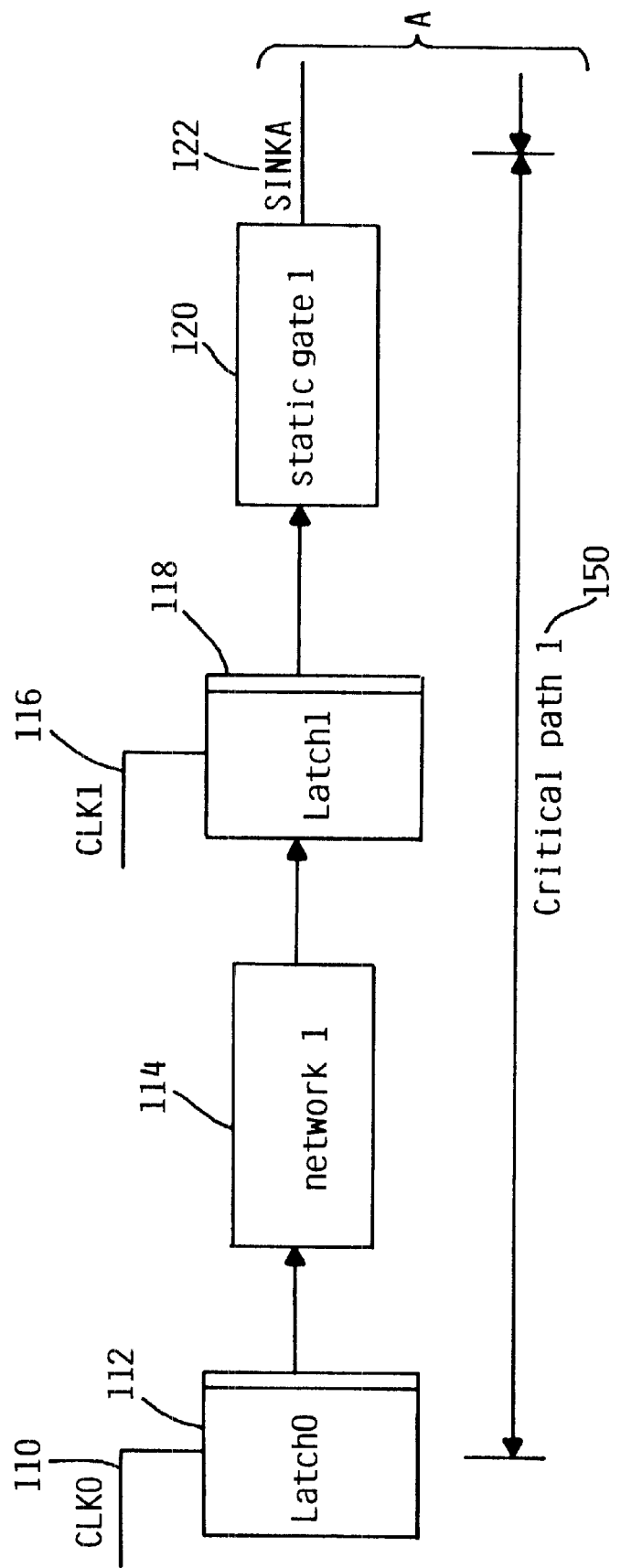
FIGS. 1(a) and 1(b) are simplified block diagrams of a prior art dynamic circuit.
Figures 1, 1A, 2:
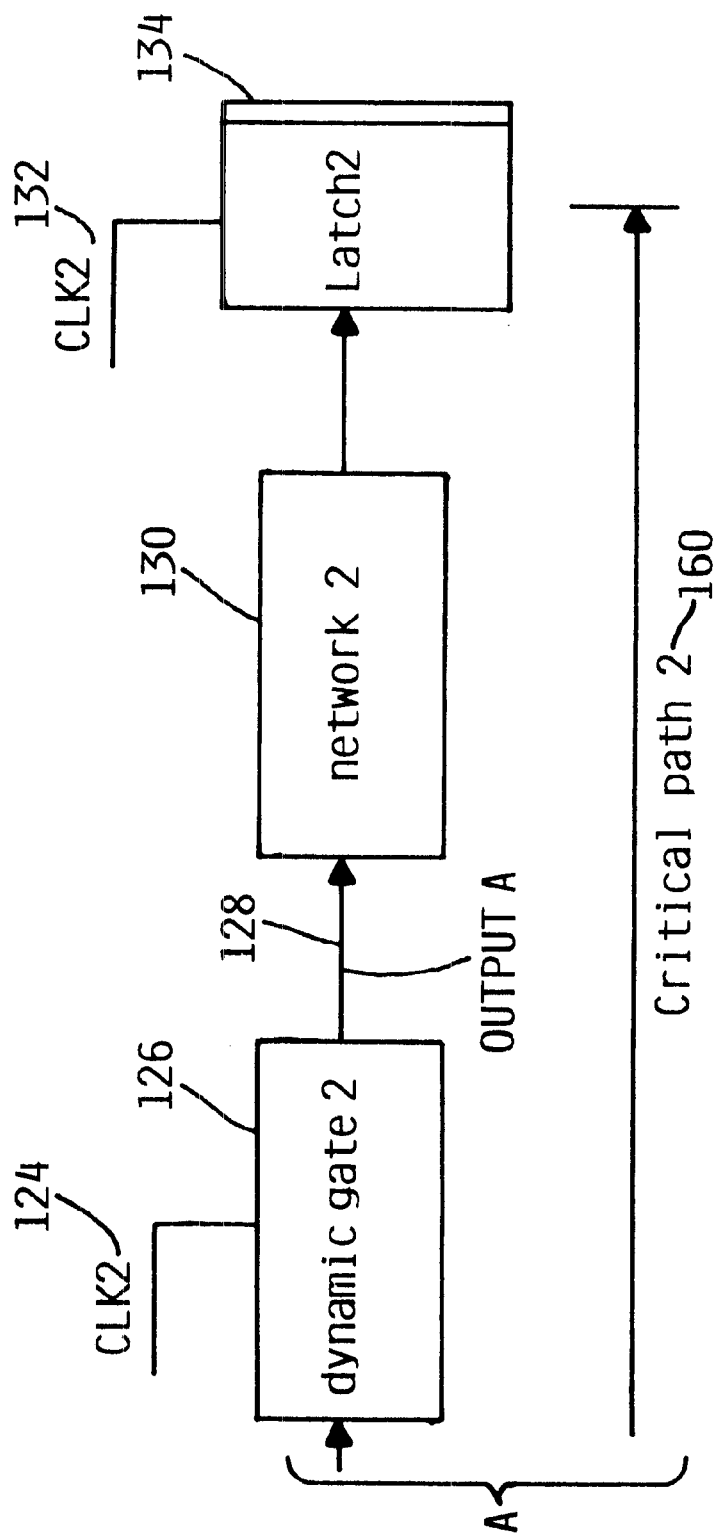
FIG. 2 is simplified circuit diagram of a prior art dynamic gate that can be used in the circuit diagram of FIG. 1(b).
Figures 1, 1B:
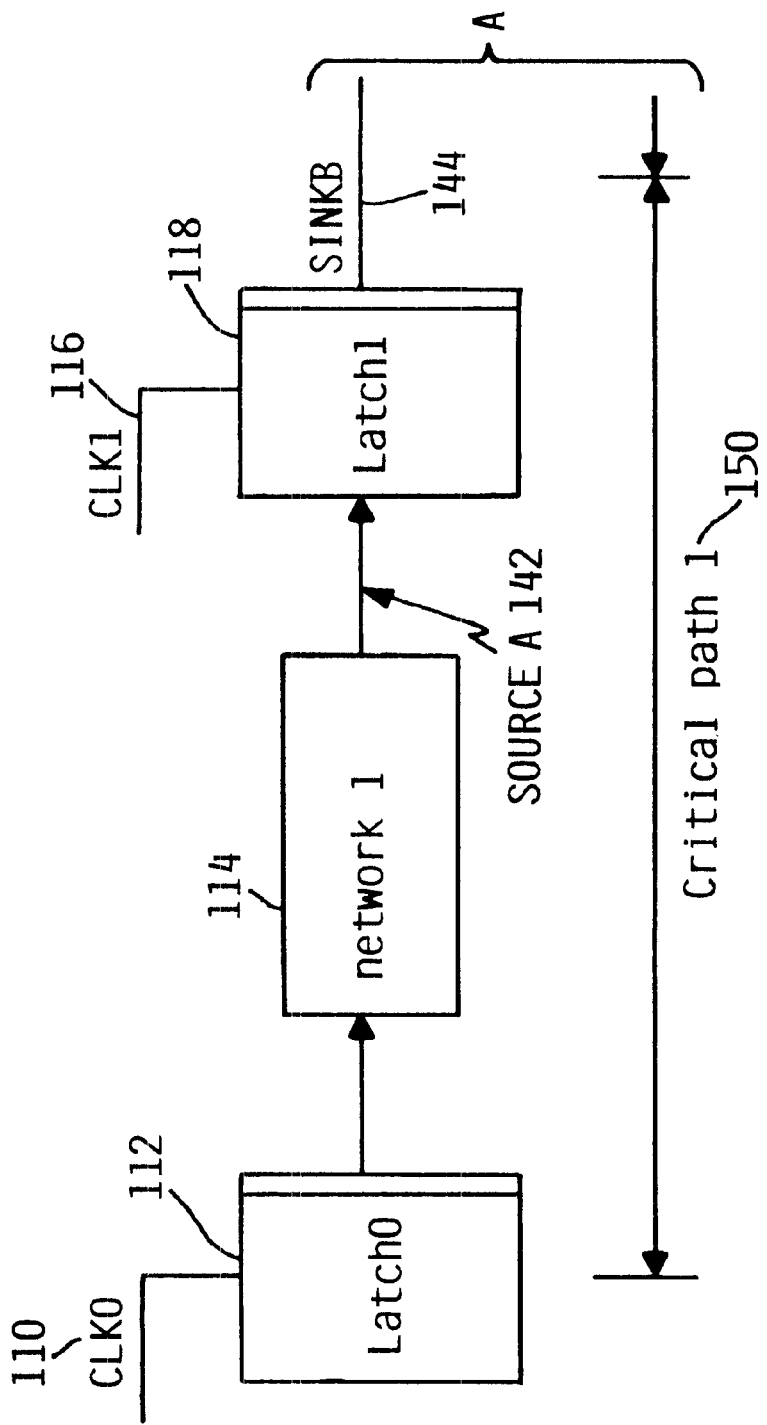
Figures 1, 1B, 2:
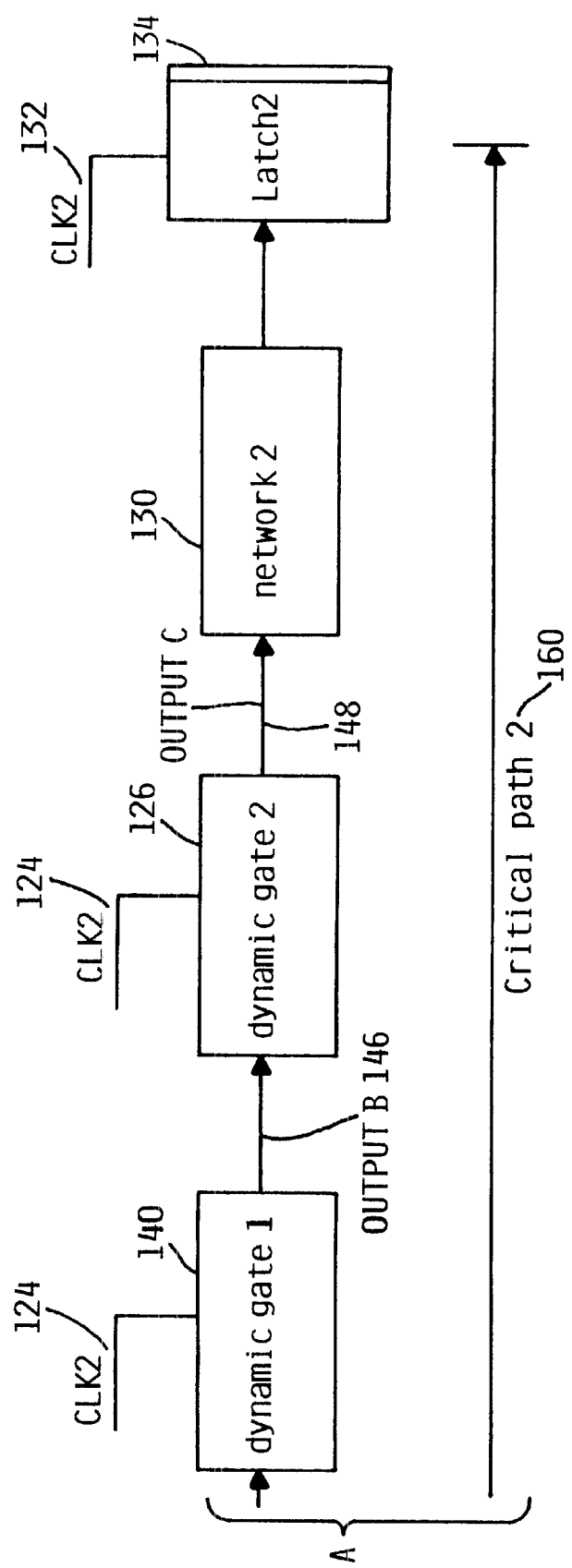
Figure 2A:
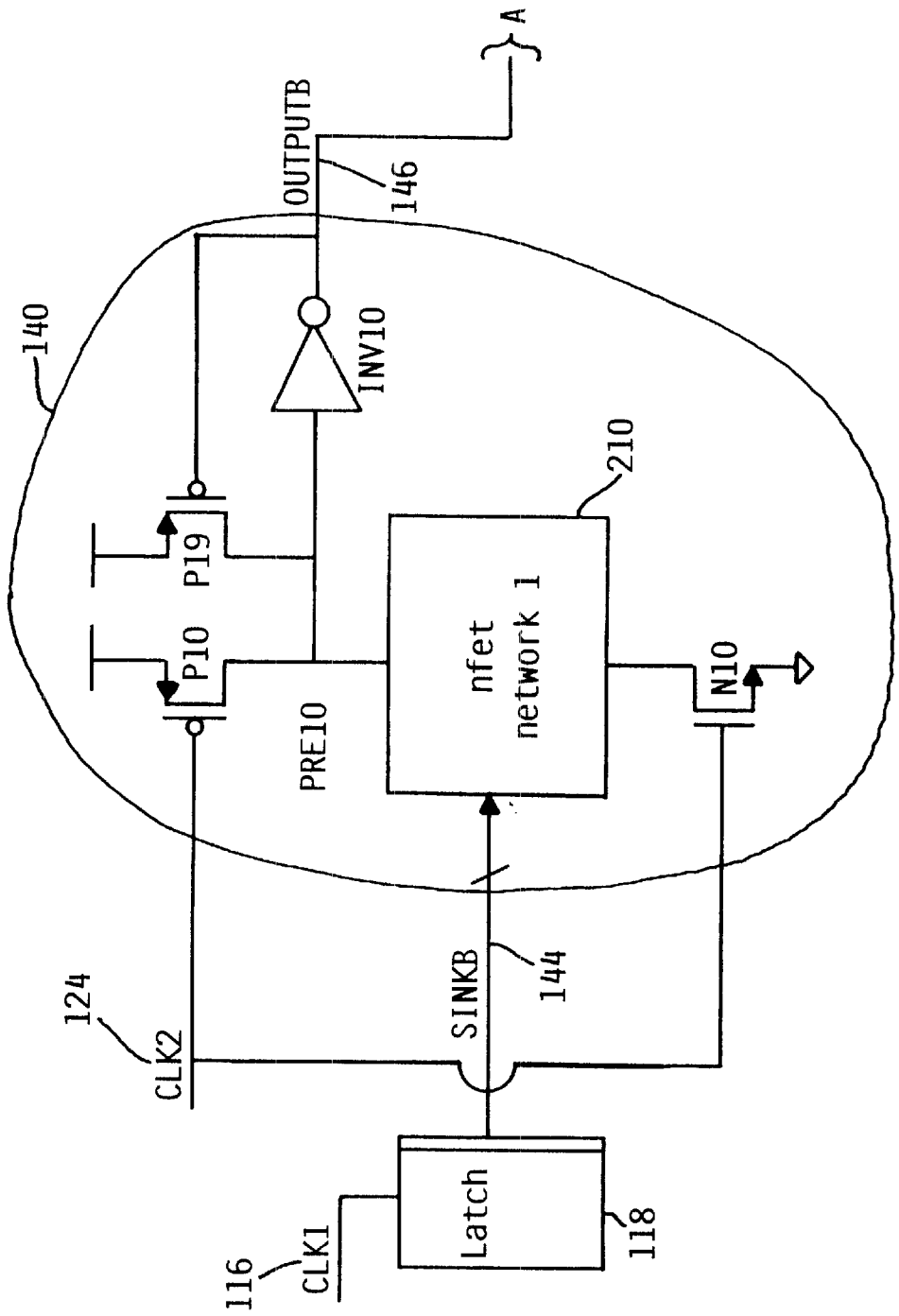
Figure 2B:
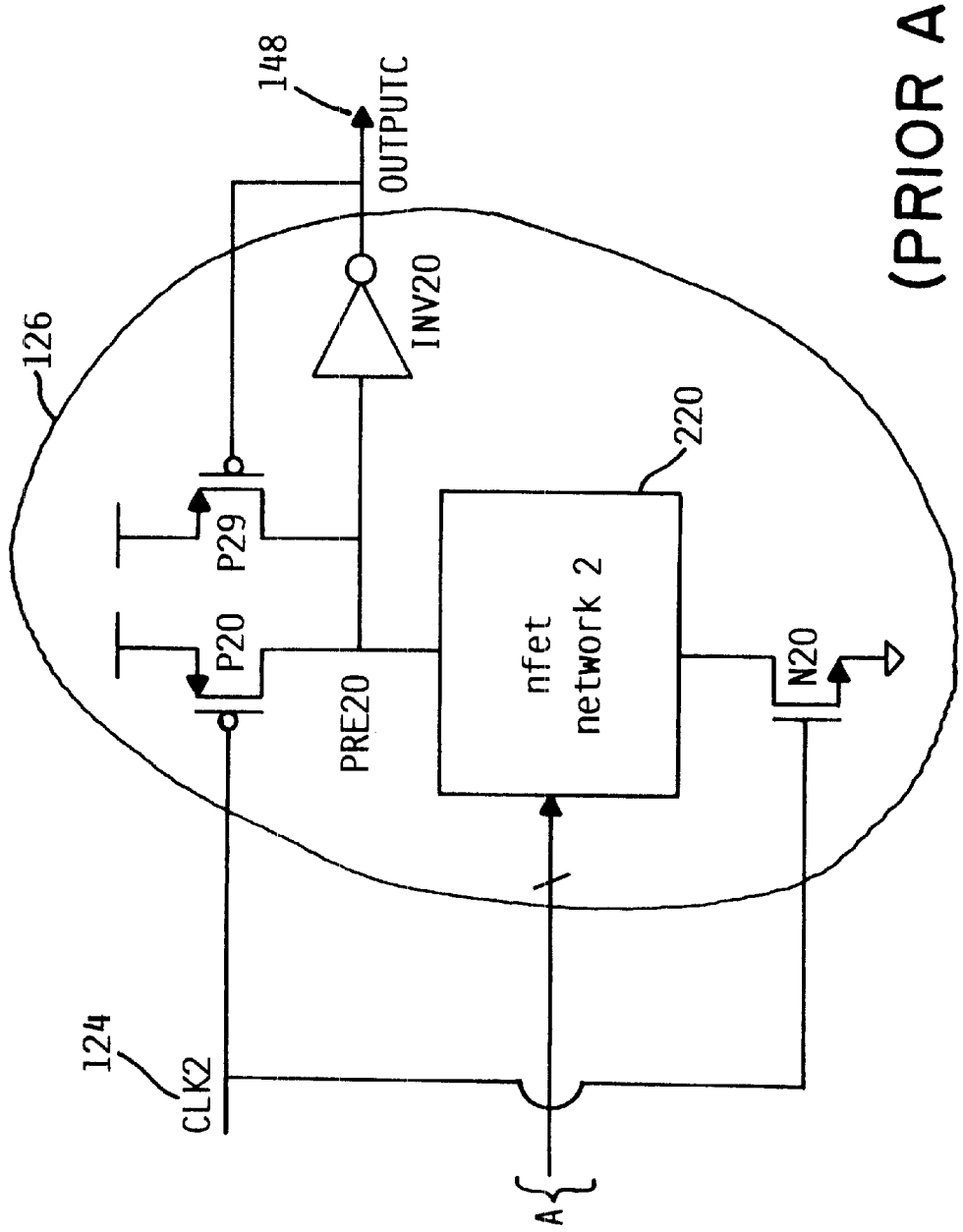
Figure 3A:
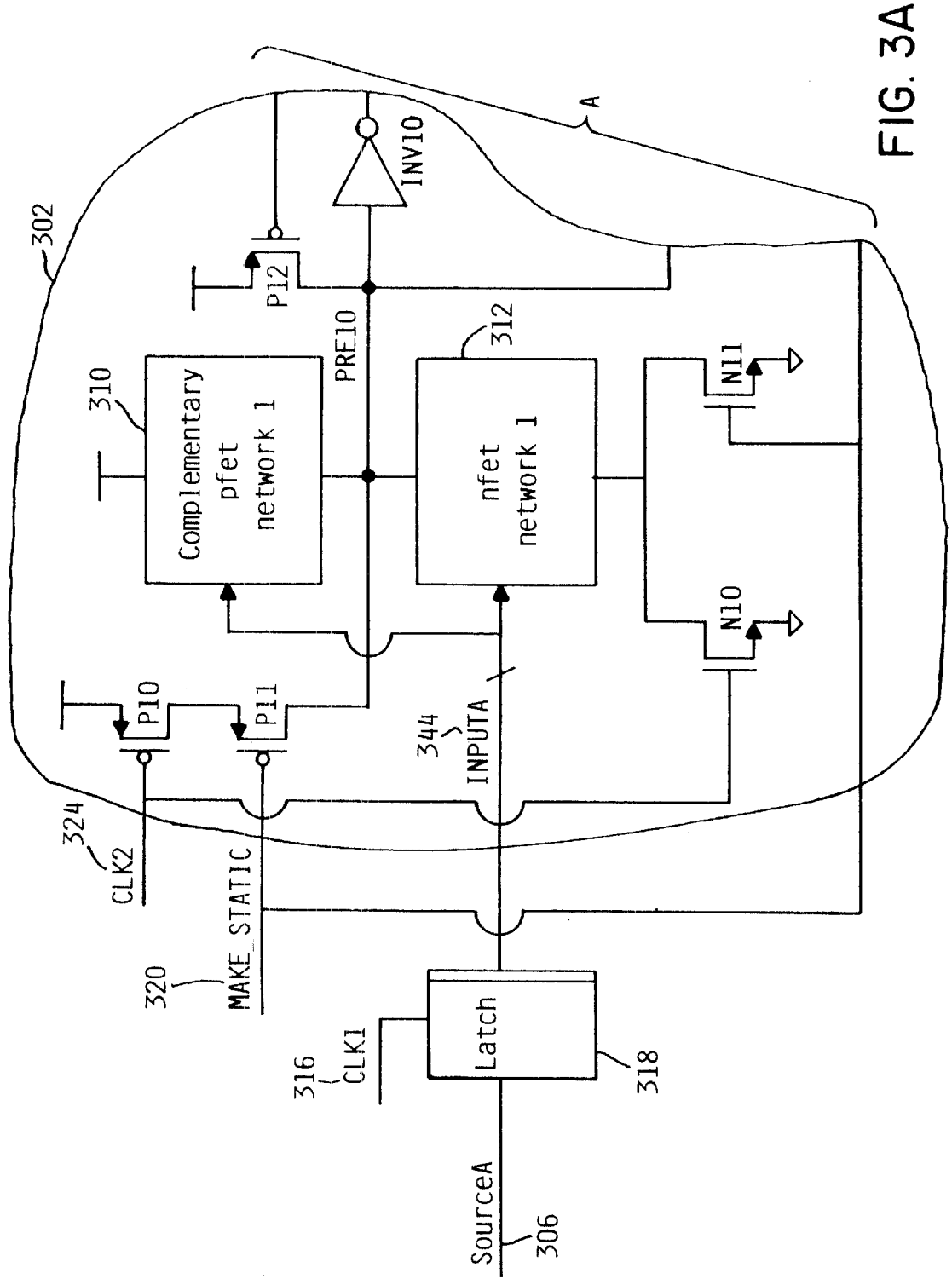
FIG. 3 is a simplified block diagram of a dynamic circuit having a programmable gate in accordance with principles of the invention. It is suggested that FIG. 3 be printed on the cover of the patent.
Figure 3B:
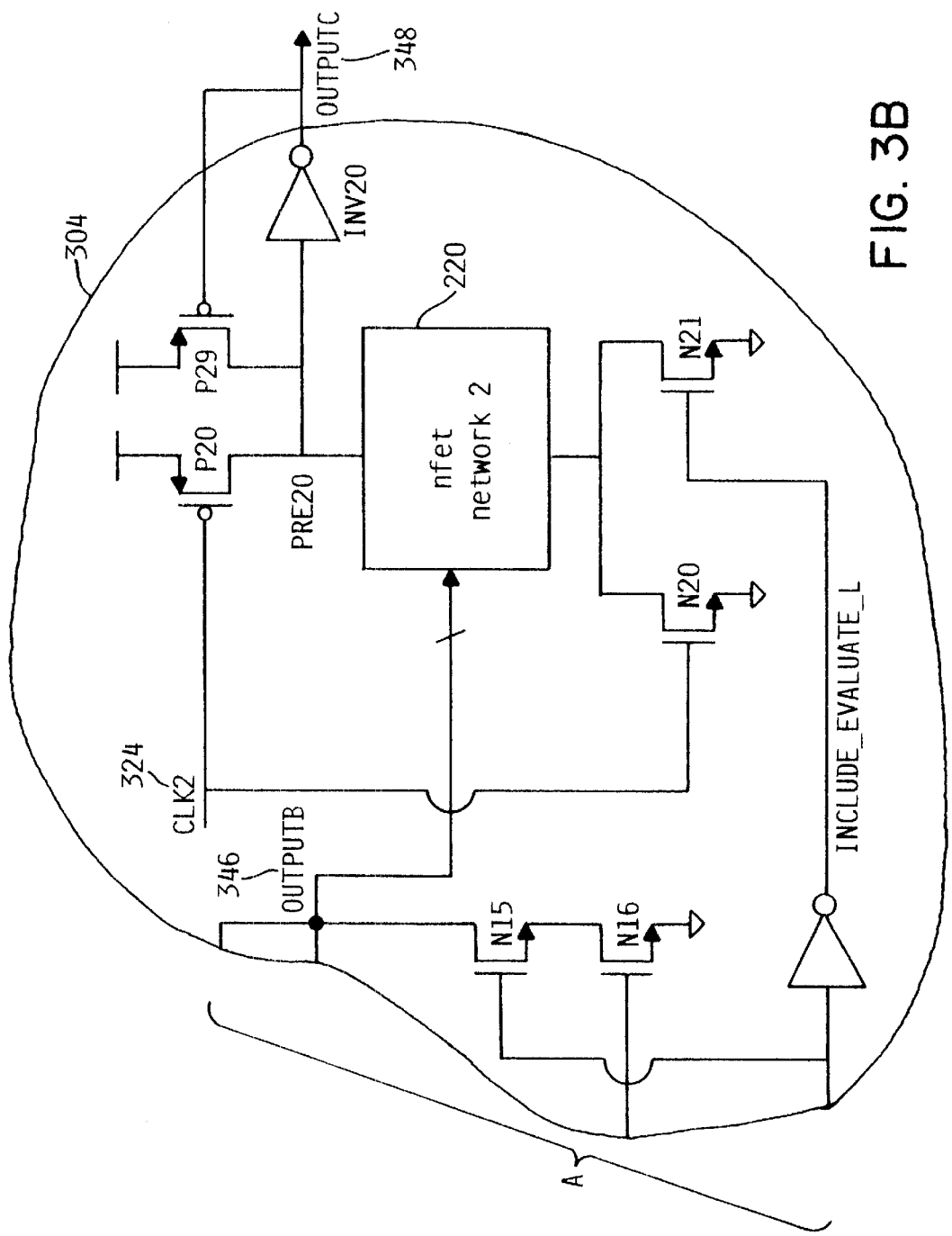

FIG. 3 is a simplified circuit diagram of an embodiment of a programmable gate 302 in combination with a dynamic gate 304 that can be included into a domino circuit in accordance with principles of the invention. A programmable gate 302 such as that shown in FIG. 3 embodies features of both a static gate and a dynamic gate. It is contemplated that in the example given in FIG. 1(a), programmable gate 302 substitute for static gate 120; and in the example given in FIG. 1(b) the programmable gate 302 replace dynamic gate 140; as such, the programmable delay of FIG. 3 is shown to be positioned after latch 318 and before the dynamic gate 304. It is to be further understood that the programmable gate 302 shown in FIG. 3 is only one embodiment and those of skill in the art know that other possible hardware implementations will realize such a programmable delay to move the timing boundary between two adjacent critical paths. One of skill in the art, moreover, will recognize the usefulness of the programmable delay, in circuits other than the circuits shown in FIGS. 1(a) and 1(b), but that the dynamic circuits may have fewer or more logic elements.

The placement of the programmable gate 302 into a domino logic circuit is determined by the timing boundary between two adjacent signal paths. Logic circuits may be configured into a plurality of stages, each of which function during a singular timing domain. The adjacent stage receives the output of the previous stage but may function on a different timing domain. In domino logic, the latches and gates in a stage quickly propagate the signal which cascades in a domino-like fashion on one clock phase until it typically reaches a latch followed by a domino gate with an evaluate device at which point the signal enters another stage which may cascade similarly on the other or a different clock phase. It is a latch followed by a domino gate with the evaluate device which defines the timing boundary of a domino stage.

The programmable gate 302 then is preferably placed after a latch, such as latch 318, and embodies features of both a static and a dynamic gate. Preferably, in FIG. 3, programmable gate 302 becomes programmable with the addition of complementary pfet network 310, P11, and N11 and the value of input signal MAKE_STATIC 320.

If the value of the input signal MAKE_STATIC 320 is low, the programmable gate 302 is dynamic and the timing boundary of the first critical path shifts and is located immediately before the programmable gate 302 at INPUTA 344. The delay associated with the programmable gate 302 becomes part of the second critical path 160. In this case, i.e., when MAKE_STATIC 320 is low, the precharge device pfet P10 precharges node PRE10 as it should when CLK2 324 is low, and also shuts off nfet N11 thereby allowing nfet N10 to function as the evaluate device for the gate. Pfet P12 holds node PRE10 high. Because the programmable gate 302 is dynamic it is desirable that it favor the rising edge of OUTPUTB 346 and inverter INV10 preferably is skewed to do that. Having MAKE_STATIC 320 low turns off nfet N15 thereby preventing nfets N15 and N16 from affecting the favored edge during dynamic mode of operation. The programmable gate 302 has an evaluate device nfet N10 as the beginning of the next stage of domino logic in the second critical path 160 so it is not necessary to have one in the second dynamic gate 304 so nfet N21 shorts out the evaluate device nfet N20 in the second dynamic gate 304 helping to make it faster.

If the delay associated with the programmable gate 302 is desired to be a part of the first critical path 150, then it should be static and the input signal MAKE_STATIC is preferably set high; the timing boundary of first critical path is set after the programmed static gate at OUTPUTB 346. The high MAKE_STATIC signal 320 causes the precharge device pfet P10 to be de-gated from the circuit and shorts out the evaluate device nfet N10 below the nfet network 210. Pfet network 310 is the logical complement of nfet network 312 so taken together they form an ordinary static gate of any desired logical function. Notice that additional optional nfets N15 and N16 speed up the edge which was slowed down during the dynamic mode of operation by fixing the skew of inverter INV10 so that neither edge is favored. Now the second dynamic gate 304 must have an evaluate device because it now becomes the first domino gate after a latch 318, so nfet N21 is turned off allowing nfet N20 to function as its evaluate device.

Thus, in the preferred embodiment the addition of complementary pfet network 310, pfet P11, nfets N11, N15, N16, N20, and N21 and an input signal MAKE_STATIC 320 in a dynamic domino gates enables the first gate after a domino latch to be either static or dynamic. As a result, the programmable gate 302 can be a part of the first critical path 150 or a subsequent critical path 160, as in FIGS. 1(a) and 1(b) depending upon the need. In circumstances, where a designer wishes to balance the delays between two adjacent paths to make the time a signal traverses each path to be a close to the other as is possible, it has been determined that the delay associated with one programmable delay is enough to mitigate the uncertainty in delay resulting from the inaccuracy of the hardware-to-model correlation. Indeed, after the circuits have been fabricated the designer can adjust MAKE_STATIC 320 to decide which mode, i.e., whether the programmable gate 302 should be static or dynamic, improves the overall performance of the machine. This decision can even be made at wafer test to help improve the yield of high performing circuits. For example, if a particular defect slows down one of the critical paths, the tests could adjust MAKE_STATIC 320 to give the best possible performance for the circuit in spite of the defect. On the other hand, there may be circumstances where it is preferred to have one path substantially longer than the adjacent path, in which the programmable gate can be programmed to extend the delay of an already long critical path.

Delay results were obtained when a programmable gate 302 in accordance with principles of the invention was incorporated into a domino two-way OR gate and the second dynamic gate 304 was a dynamic four-way OR gate, as shown in FIG. 3. The first critical path starts at SOURCEA 306 before latch 318 and ends at either INPUTA 344 or at OUTPUTB 346 depending upon the value of MAKE_STATIC 320. The second critical path starts from wherever the first one ends and ends at the output of the 4-way OR gate, OUTPUTC 348. It will be understood that the test case is by way of example only and either or both critical paths could be longer and contain more logic. The test case compared the timing of OUTPUTB 346 in the circuit of FIG. 3 in which the programmable gate 302 was a 2-way OR gate and the dynamic gate 304 was a 4-way OR gate. In static mode, the programmable 2-way OR gate 302 is part of the first critical path which functions when the clock signal CLK2 324 is low. The second critical path functions when the clock phase when CLK2 324 is high. Actual test results show when MAKE_STATIC 320 is low to make the programmable gate 302 a dynamic gate, the OUTPUTB signal 346 is actually output approximately 400–500 picoseconds when compared to the OUTPUTB 346 signal when the programmable gate 302 was a static gate and part of the first critical path. That is, when the programmable gate 302 was a dynamic gate, the OUTPUTB signal 345 was output after CLK2 124 was clearly indicates that the programmable gate 302 is included in the second critical path.

Another simulation test was conducted on the circuit of FIG. 3 and when the programmable gate 302 was the 2-way OR gate and the dynamic gate 304 was the 4-way OR gate, as above. The purpose of the test to determine the time delay consequences resulting from adding the additional pfet network 310, pfets P11, and nfets N11, N15, N16, N20, and N21. The programmable gate 302 was programmed to be a dynamic gate with MAKE_SIGNAL set low so that the gate would become part of the second critical path. The time through various points of the signal through the circuit shown in FIG. 3 was compared with an analogous circuit in which the first gate was not a programmable gate, such as the dynamic gate 140 in FIG. 1(*b*). The output OUTPUTB 346 of the programmable dynamic gate 302 was delayed approximately six picoseconds from the output OUTPUTB 146 of a conventional dynamic gate 140, the programmed gate 302 being slowed down somewhat because of the additional capacitive loading of the complementary pfet network 310. The output OUTPUTC 348 was delayed approximately twelve picoseconds from the output OUTPUTC 148 of an analogous dynamic domino circuit without the programmable delay, such as in FIG. 1(*b*). Compared with the amount of time that is being switched back and forth across the timing boundary which can be from forty picoseconds to seventy-five picoseconds depending on the circuits used, the delay penalty resulting from the extra circuit is not extreme and can be effectively minimized.

This invention thus creates a programmable timing boundary for dynamic circuits such that the designer can take a delay from one critical path and place it in an adjacent critical path at the hardware level and then choose the placement of the timing boundary that achieves the desired result, usually the desired result being that the delay is balanced between the two paths by making the delays as near equal as possible. The ability to switch one stages' worth of delay between critical paths generally is enough to cover the uncertainty in delay associated with typical hardware-to-model correlations so that the delay uncertainty resulting from modeling inaccuracy can be eradicated and the critical paths can be balanced. The additional input signal, MAKE_STATIC 320, and the additional circuitry adds minimal delay penalty, especially in comparison with the penalty associated with an incorrectly placed delay. This technique and inclusion of a hardware programmable delay is very localized in its effect unlike techniques which shift timing boundaries between time domains by manipulating and delaying clock signals. Such methods which involve manipulation of the clock or other signal often propagate accumulated delays throughout the entire system and unpredictable errors far from the location of the critical path attempted to be corrected. The inventive method as described herein, moreover, further allows programmability of intentionally inserting a delay to achieve a extraordinary delay which may be desirable under some circumstances.

While various embodiments of the present invention have been described above, it should be understood that they have been presented by way of example, and not limitation, and variations are possible. Thus, the breadth and scope of the present invention should not be limited by any of the above-described exemplary embodiments, but should be defined only in accordance with the following claims and their equivalents.

What is claimed is:

1. A method to move a timing boundary between two adjacent timing paths; said method comprising:
   placing a programmable gate at a boundary of said two adjacent timing paths;
   (a) programming said programmable gate to be included in a first of said two adjacent timing paths; and
   (b) alternatively, programming said programmable gate to be included in a second of said two adjacent timing paths;
   (c) and inputting a first signal that is high to program said programmable gate as a static gate.

2. The method of claim 1, wherein said step of programming said programmable gate to be a static gate further comprises:
   (a) degating a precharge device in said programmable gate; and
   (b) shorting an evaluate device in said programmable gate.

3. A method to move a timing boundary between two adjacent timing paths; said method comprising:
   (a) placing a programmable gate at a boundary of said two adjacent timing paths;
   (b) programming said programmable gate to be included in a first of said two adjacent timing paths; and
   (c) alternatively, programming said programmable gate to be included in a second of said two adjacent timing paths;
   (d) and inputting an input signal that is low to program said programmable gate as a dynamic gate.

4. The method of claim 3, wherein said step of programming said programmable gate to be a dynamic gate further comprises:
   (a) charging a precharge node with a precharge device in said programmable gate;
   (b) allowing a first evaluate device in said programmable gate to evaluate a value of an input logic signal;

(c) favoring a rising edge of an output signal from said programmable gate; (d) shorting out a second evaluate device in an adjacent second dynamic gate of said second timing path.

5. A method to move a timing boundary between two adjacent timing paths; said method comprising:
   (a) placing a programmable gate at a boundary of said two adjacent timing paths;
   (b) programming said programmable gate to be included in a first of said two adjacent timing paths;
   (c) alternatively, programming said programmable gate to be included in a second of said two adjacent timing paths;
   (d) inputting a first signal to program said programmable gate;
   (e) testing a circuit having said two adjacent timing paths which are critical paths to determine which of said paths is the slower; and
   (f) inputting said first signal to place said programmable gate in the faster of said two critical paths.

6. The method of claim 5, wherein said step of testing occurs when said circuits are in a semiconductor wafer.

7. The method of claim 5, wherein said step of testing occurs when said circuits are mounted on an electronic chip.

8. A method to move a timing boundary between two adjacent timing paths; said method comprising:
   (a) placing a programmable gate at a boundary of said two adjacent timing paths;
   (b) programming said programmable gate to be included in a first of said two adjacent timing paths;
   (c) alternatively, programming said programmable gate to be included in a second of said two adjacent timing paths;
   (d) inputting a first signal to program said programmable gate;
   (e) testing a circuit having said two adjacent timing paths which are also critical paths to determine which of said paths is the slower; and
   (f) inputting said first signal to place said programmable gate into the slower of said two critical paths.

9. An electronic system comprising a number of domino logic circuits having programmable timing boundaries that can be changed by a plurality of gates that can be programmed to be either a static gate or a dynamic gate.

10. An electronic circuit, comprising:
    (a) a first domino logic stage having a first timing domain;
    (b) a second logic domino stage having a second timing domain, said second domino logic stage being adjacent to said first domino logic stage;
    (c) a programmable gate at a boundary of said first domino logic stage and said second domino logic stage, said programmable gate capable of being in either of said first or second domino logic stages, and said programmable gate further comprising:
        (i) an input signal to program said programmable gate;
        (ii) a precharge device connected to a clock signal;
        (iii) an evaluate device connected to said clock signal:
        (iv) a logic network to perform a digital operation on a logic signal; and
        (v) a shorting device connected to said evaluate device.

11. The logic circuit of claim 10, further comprising a complementary logic network and whereupon when said input signal is high, said precharge device is degated from said logic circuit and said shorting device shorts said evaluate device, and said logic network forms a static gate with said complementary logic network and said programmable gate is included in said first domino stage.

12. The logic circuit of claim 10, whereupon said input signal being high, said precharge device precharges a precharge node, and said evaluate device evaluates a logic output from said logic network which forms a dynamic gate and said programmable gate is included in said second domino stage.

13. The logic circuit of claim 12, wherein said second domino stage further comprises a second dynamic gate and a second evaluate device in which said programmable gate causes said second evaluate device to be shorted.

14. An electronic circuit having an adjustable timing boundary between two adjacent stages, comprising:
    (a) means to input a program signal;
    (b) means to program a delay gate to comprise a first of said two adjacent stages upon the value of said program signal; and
    (c) means to program said delay gate to comprise a second of said two adjacent stages upon a different value of said program signal.

* * * * *